(12) United States Patent
Zhuang et al.

(10) Patent No.: US 7,625,595 B2
(45) Date of Patent: Dec. 1, 2009

(54) METHOD OF MONITORING PCMO PRECURSOR SYNTHESIS

(75) Inventors: Wei-Wei Zhuang, Vancouver, WA (US); David R. Evans, Beaverton, OR (US); Tingkai Li, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 772 days.

(21) Appl. No.: 11/403,022

(22) Filed: Apr. 11, 2006

(65) Prior Publication Data
US 2007/0238203 A1 Oct. 11, 2007

(51) Int. Cl.
*B05D 5/12* (2006.01)
(52) U.S. Cl. .......................... 427/8; 427/240; 427/595; 118/688; 118/712
(58) Field of Classification Search .................. 427/8, 427/240, 595; 118/688, 712
See application file for complete search history.

(56) References Cited

U.S. PATENT DOCUMENTS

| | | | |
|---|---|---|---|
| 2003/0108670 A1* | 6/2003 | Zhuang et al. | 427/240 |
| 2004/0170761 A1 | 9/2004 | Zhuang et al. | |

* cited by examiner

*Primary Examiner*—Kirsten C Jolley
(74) *Attorney, Agent, or Firm*—David C. Ripma

(57) ABSTRACT

A method of monitoring synthesis of PCMO precursor solutions includes preparing a PCMO precursor solution and withdrawing samples of the precursor solution at intervals during a reaction phase of the PCMO precursor solution synthesis. The samples of the PCMO precursor solution are analyzed by UV spectroscopy to determine UV transmissivity of the samples of the PCMO precursor solution and the samples used to form PCMO thin films. Electrical characteristics of the PCMO thin films formed from the samples are determined to identify PCMO thin films having optimal electrical characteristics. The UV spectral characteristics of the PCMO precursor solutions are correlated with the PCMO thin films having optimal electrical characteristics. The UV spectral characteristics are used to monitor synthesis of future batches of the PCMO precursor solutions, which will result in PCMO thin films having optimal electrical characteristics.

5 Claims, 4 Drawing Sheets

METHOD OF MONITORING PCMO PRECURSOR SYNTHESIS

FIELD OF THE INVENTION

This invention relates to use of UV spectroscopy to monitor the synthesis of a $Pr_{0.7}Ca_{0.3}MnO_3$ (PCMO) spin-coating precursor.

BACKGROUND OF THE INVENTION

Our prior disclosure for Precursor Solution and Method for Controlling the Composition of MOCVD Deposited PCMO, published Feb. 27, 2003, as U.S. Patent Publication No. 2004/0170761-A1, describes techniques for making a PCMO precursor solution, and is incorporated herein by reference. A problem associated with PCMO thin film deposition is that the preparation of a PCMO precursor solution may be inconsistent, resulting in PCMO thin films having less than optimal electrical characteristics. The method of the invention provides a protocol for monitoring PCMO spin-coating precursor solution synthesis, and thus solves the problem relating to the control of precursor synthesis.

SUMMARY OF THE INVENTION

A method of monitoring synthesis of PCMO precursor solutions includes preparing a PCMO precursor solution; withdrawing samples of the PCMO precursor solution at intervals during a reaction phase of the PCMO precursor solution synthesis; analyzing the samples of the PCMO precursor solution by UV spectroscopy to determine UV transmissivity of the samples of the PCMO precursor solution; forming a PCMO thin film from the samples of the PCMO precursor solution; determining electrical characteristics of the PCMO thin films formed from the samples of the PCMO precursor solution to identify PCMO thin films having optimal electrical characteristics; determining the UV spectral characteristics of the PCMO thin films having optimal electrical characteristics; and monitoring future PCMO precursor solution synthesis form the UV spectral characteristics of the PCMO thin films having optimal electrical characteristics to synthesize PCMO precursor solutions which will result in PCMO thin films having optimal electrical characteristics.

It is an object of the invention to provide a reliable method for monitoring the synthesis and quality of a PCMO precursor solution.

Another object of the invention is to determine a suitable reaction period for obtaining high quality PCMO spin-coating precursor solutions.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Monitoring a $Pr_{0.7}Ca_{0.3}MnO_3$ (PCMO) spin-coating precursor synthesis process is an unknown protocol. In previous synthesis protocols, PCMO solution reactions were allowed to process for a certain period of time, and then ended without any quantitative or qualitative analysis. Thus the quality of precursor, batch to batch, may be different.

In PCMO spin-coating precursor synthesis, as described in detail in the above-identified U.S. Patent Publication, the combined $Pr(OAc)_3 \cdot H_2O$, $Ca(OAc)_2 \cdot H_2O$ and $Mn(OAc)_3 \cdot 2H_2O$ acetic acid solution was processed at around 110° C. for a period of time. However, if the reaction time was too short, the resultant PCMO thin film exhibited deficiencies during a reset process. If the reaction was too long, the resultant PCMO thin film was easily shorted to a low resistance state during the reset process. Therefore, a method to determine a suitable reaction period is required for obtaining consistent high quality PCMO spin-coating precursor solutions.

Figure 1:
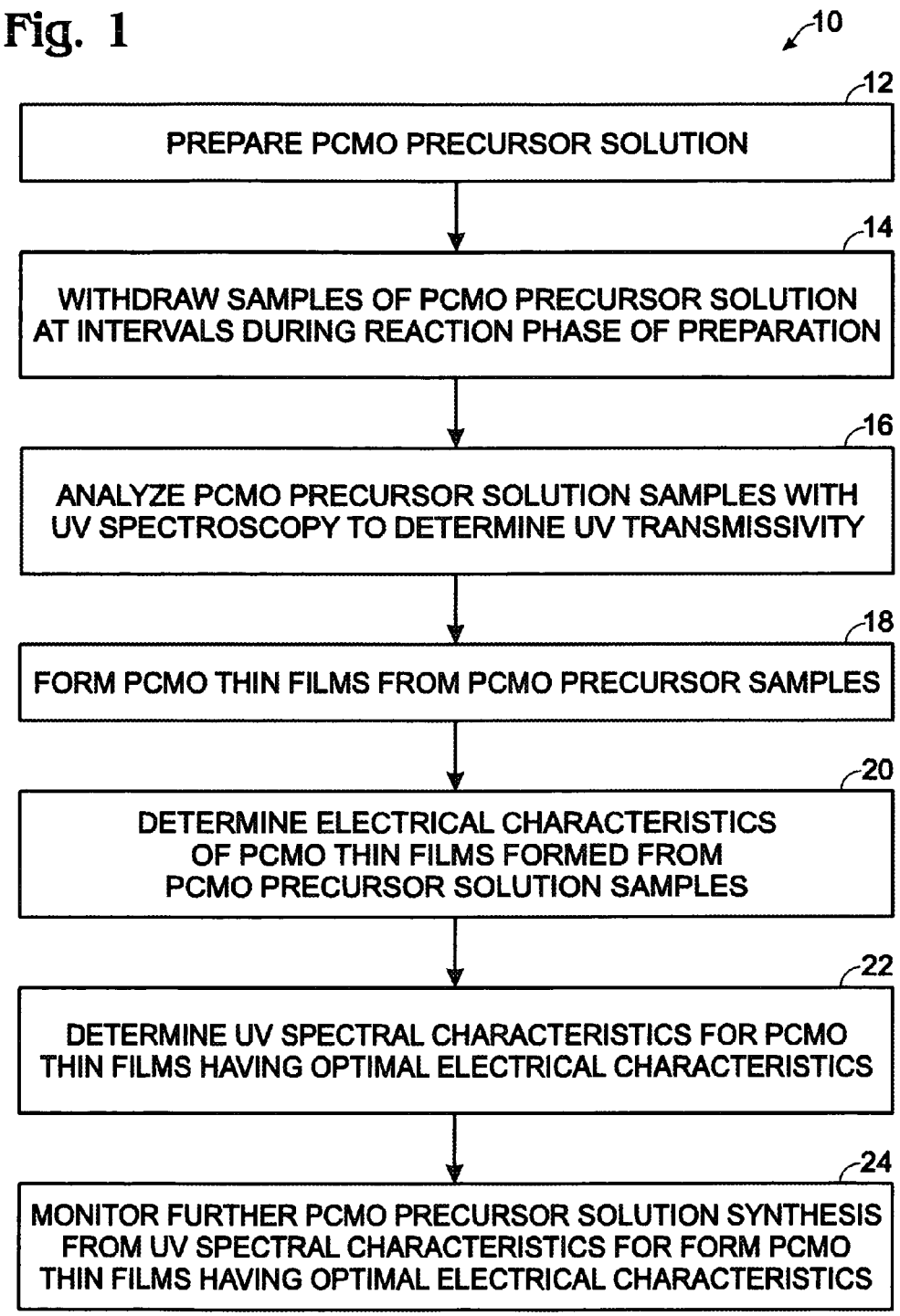
FIG. 1 is a block diagram of the method of the invention.

UV spectroscopy may be used to monitor the PCMO acetic acid solution reaction. Referring now to FIG. 1, the method of the invention is depicted generally at 10, which begins with the establishment of a standard UV spectra reference, which may be obtained from the sample solutions collected during preparation of PCMO precursor solutions, step 12, by withdrawing sample of the PCMO precursor solution at intervals during the reaction phase of the precursor solution synthesis, step 14. These sample solutions provide a series of UV spectra relating to a series of reaction time following analysis of the PCMO precursor solution samples by UV spectroscopy, step 16, which results in a comparative graph of transmissivity vs. reaction time. PCMO thin films may then be deposited from the PCMO precursor solution samples, step 18, and the electrical characteristics of the resultant PCMO thin films determined, step 20. Once the electrical properties of the PCMO thin film are determined, the PCMO precursor solution reaction times which resulted in PCMO thin films exhibiting optimal electrical properties may be determined, step 22, and the UV spectra recorded for the best reaction times may be used as a reference to monitor the PCMO precursor solution synthesis in future procedures, step 24. The following are the examples using UV to monitor the PCMO precursor solution synthesis.

Figure 2:
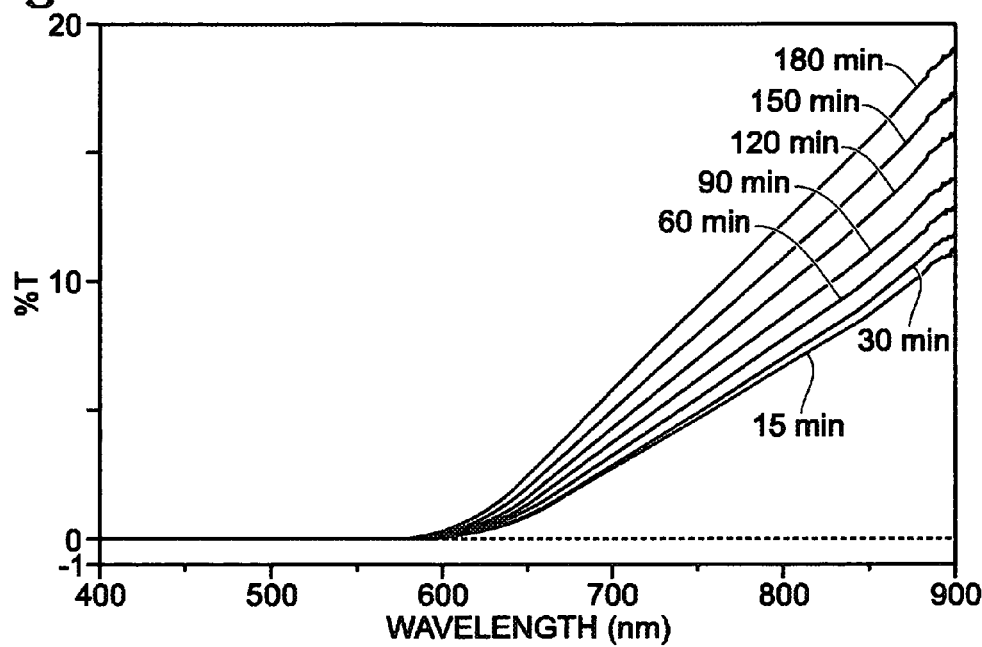
FIG. 2 depicts the UV spectra of seven sample solutions for a first run.
Figure 3:
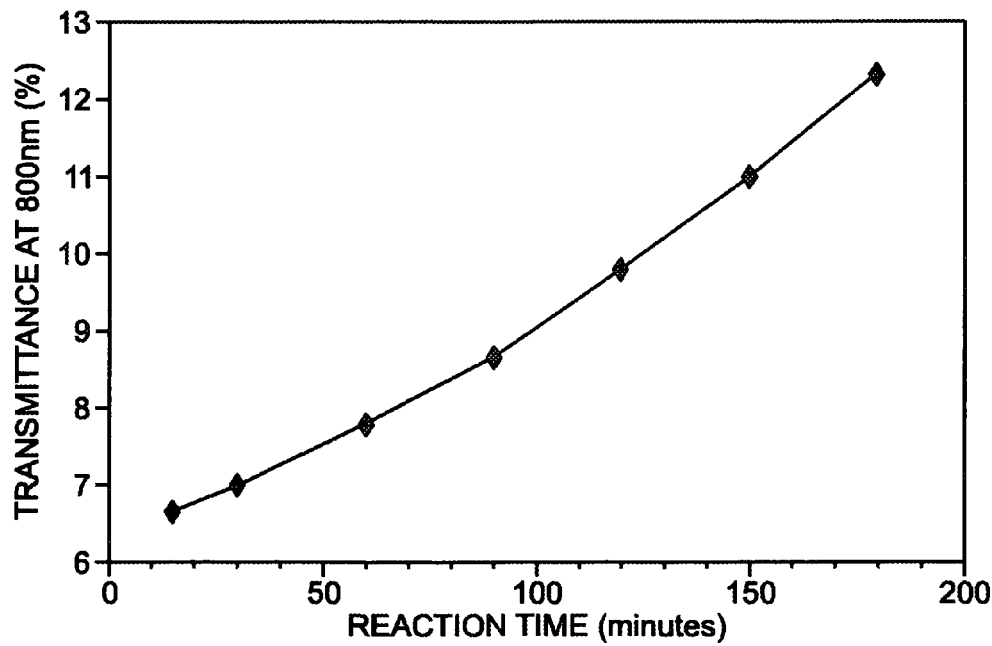
FIG. 3 depicts the UV T % at 800 nm for sample solutions of FIG. 2.

EXAMPLE ONE $Pr(OAc)_3 \cdot H_2O$, $Ca(OAc)_2 \cdot H_2O$ and $Mn(OAc)_3 \cdot 2H_2O$, purchased from Aldrich Chemicals and used without further purification, were used in the precursor synthesis process. HOOCCH3 (HOAc) was used as the solvent in the synthesis. To make a 0.25M PCMO precursor solution, $Pr(OAc)_3 \cdot H_2O$ (2.94 gram) was placed in a 100 mL round bottom flask and dehydrated at 200° C. for one hour in a furnace. HOAc (30 mL) was then introduced. The resultant $Pr(OAc)_3$ acetic acid solution was refluxed in air for two hours. $Pr(OAc)_3$ was well dissolved in solution, and was in a clear light green in color. $Ca(OAc)_2$ was formed by the dehydration of $Ca(OAc)_2 \cdot H_2O$ at 200° C. for one hour in a furnace. Then $Ca(OAc)_2$ (0.606 gram) was refluxed in 20 mL HOAc for 30 minutes, resulting in a clear, colorless solution. At the same time, $Mn(OAc)_3 \cdot 2H_2O$ (3.35 gram) was dissolved in 50 mL HOAc in a 100 mL long neck round bottom flask by heating at 110° C. for one hour. The color of the resultant $Mn(OAc)_3 \cdot 2H_2O$ HOAc solution was dark brown. The combination of three solutions were processed by combining the $Ca(OAc)_2$, $Pr(OAc)_3$, and HOAc solutions, and then pouring the $Ca(OAc)_2$, $Pr(OAc)_3$, and HOAc solution into the flask containing the $Mn(OAc)_3 \cdot 2H_2O$ HOAc solution, still held at 110° C. After mixing, the resultant PCMO precursor solution was continuously heated at 110° C. for three hours, during which time, seven sample solutions were collected, at reaction times of 15 minutes, 30 minutes, 60 minutes, 90 minutes, 120 minutes, 150 minutes and 180 minutes. UV spectra were recorded for these sample solutions, as shown in FIG. 2, which is the UV spectra of the seven sample solutions. The UV spectra established that the PCMO precursor solution has a lower transmissivity when analyzed following a short reaction period, which transmissivity increases as the reaction time increases, thus, the plots in FIG. 2 depict the lowest UV, at 800 nm, transmissivity for the shortest reaction time, and the highest UV transmissivity for the longest sampled reaction time. Shorter the reaction time is, lower the transmittance has. FIG. 3 is the UV transmittance (T %) at 800 nm for the seven sample solutions.

PCMO thin films, using the seven PCMO precursors solution samples, were deposited on $Pt/Ti/SiO_2$/wafer substrate via spin-coating process. The reversible resistance switch properties were measured, as summarized in Table 1.

TABLE 1

RRAM properties of seven sample solutions

| Reaction Time | Wafer Number | Switch Properties |
|---|---|---|
| 15 minutes | 5620 | poor |
| 30 minutes | 5408 | no rest |
| 60 minutes | 5619 | switches |
| 90 minutes | 5618 | switches |
| 120 minutes | 5626 | switches |
| 150 minutes | 5245 | switches |
| 180 minutes | 5624 | easy short | exhibited difficulty during the reset process. When the reaction time was longer than two-and-half hour, the resultant PCMO thin films were easily shorted to a low resistance state during the reset process. Thus, it appears that the optimal reaction time is in the range of one hour to two-and-half hours. Using FIG. 3 as a standard UV spectra reference for PCMO precursor synthesis procedure, optimal PCMO precursor solutions may be synthesized by allowing the reaction to proceed until the UV transmissivity of the PCMO precursor solution is in the range of 7.8% to 11%.

EXAMPLE 2

Figure 4:
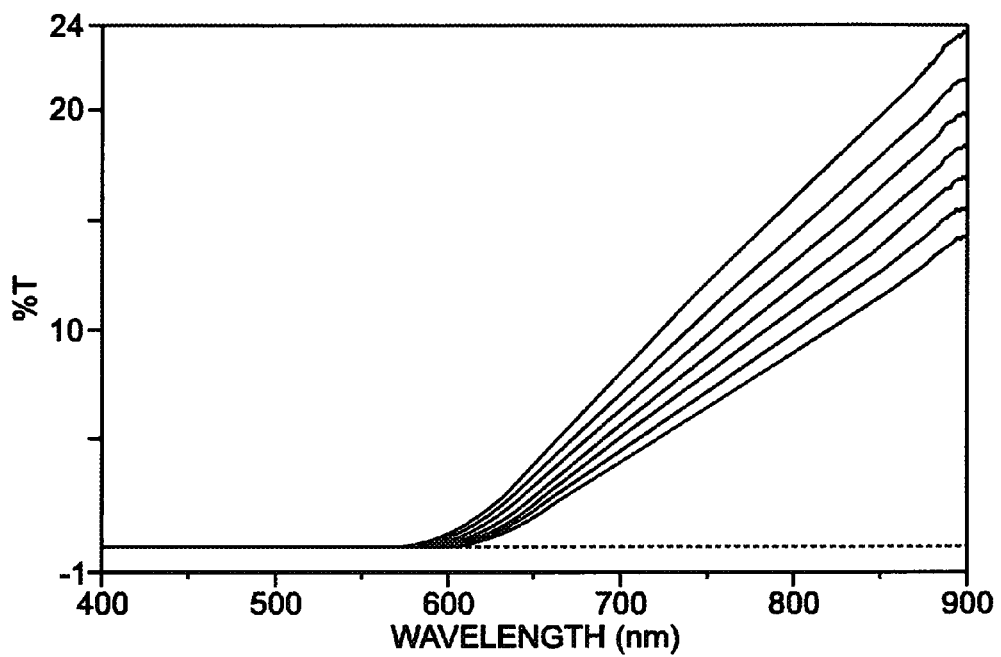
FIG. 4 depicts the UV spectra of seven sample solutions of a second run.
Figure 5:
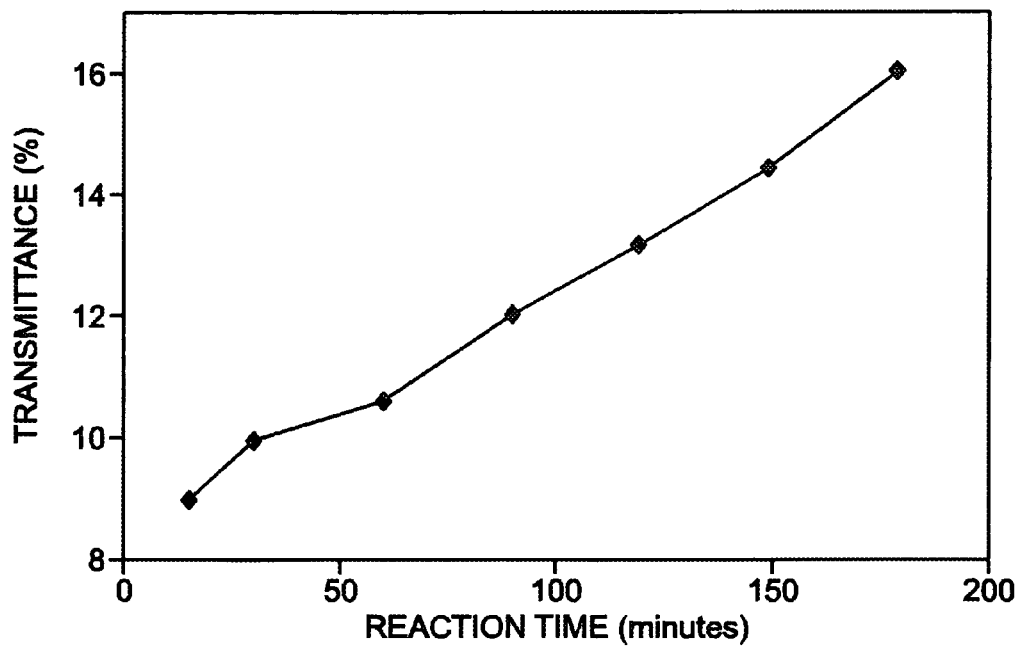
FIG. 5 depicts the UV T % at 800 nm for sample solutions of FIG. 4.
Figure 6:
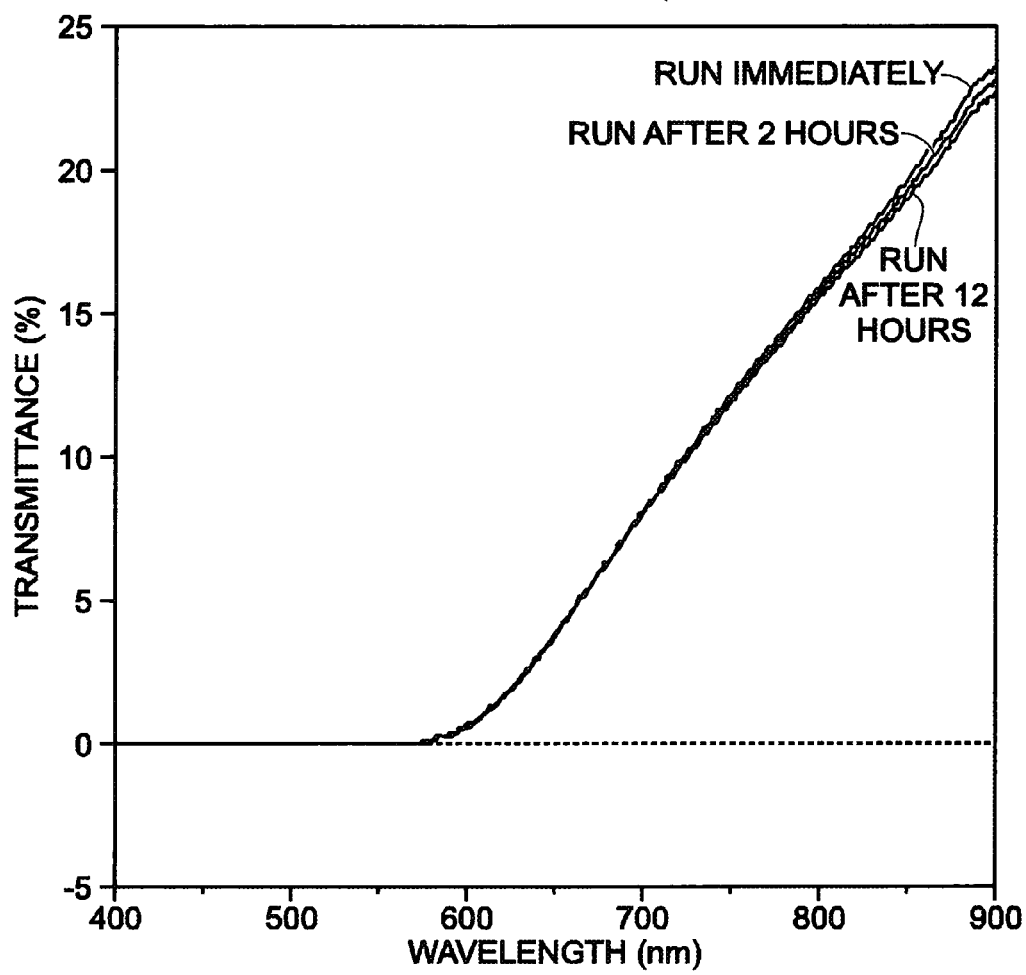
FIG. 6 depicts a UV spectra run over 12 hours.

A PCMO precursor solution was prepared as in Example 1. UV spectra of seven samples were collected and are shown in FIG. 4. The T % at 800 nm for these samples is shown in FIG. 5. The stability of PCMO precursor solution has been tested by running UV spectra over a period of time, as shown in FIG. 6, which demonstrates that the PCMO precursor solutions generate nearly the same UV spectra over 12 hours, which verifies the stable performance of the PCMO precursor solution. The electrical measurement on these series of samples established that only the sample allowed to react for 15 minutes or less exhibited good reversible resistance switch properties. Thus in the case of $Mn(OAc)_3 \cdot 2H_2O$ pre-heated at 110° C. for 5 hours, T % at 800 nm of PCMO solution UV spectrum should be less than 9% for obtaining working PCMO precursor solutions.

Thus, a method for monitoring the synthesis of a PCMO precursor solution has been disclosed. It will be appreciated that further variations and modifications thereof may be made within the scope of the invention as defined in the appended claims.

We claim:

1. A method of monitoring synthesis of PCMO precursor solutions, comprising:
   preparing a PCMO precursor solution;
   withdrawing samples of the PCMO precursor solution at intervals during a reaction phase of the PCMO precursor solution synthesis;
   analyzing the samples of the PCMO precursor solution by UV spectroscopy to determine UV transmissivity of the samples of the PCMO precursor solution;
   forming a PCMO thin film from the samples of the PCMO precursor solution;
   determining electrical characteristics of the PCMO thin films formed from the samples of the PCMO precursor solution to identify PCMO thin films having optimal electrical characteristics;
   determining the UV transmissivity range of the PCMO thin films having optimal electrical characteristics; and
   monitoring future PCMO precursor solution synthesis from the UV transmissivity range of the PCMO thin films having optimal electrical characteristics to synthesize PCMO precursor solutions which will result in PCMO thin films having optimal electrical characteristics.

2. The method of claim 1 wherein said determining electrical characteristics of the PCMO thin films formed from the samples of the PCMO precursor solution to identify PCMO thin films having optimal electrical characteristics includes determining which PCMO precursor solution samples result in a PCMO thin film have switching properties and which do not result in a short forming during a reset process.

3. The method of claim 1 wherein said analyzing the samples of the PCMO precursor solution by UV spectroscopy includes analyzing the samples of the PCMO precursor solution at a wavelength of about 800 nm.

4. A method of monitoring synthesis of PCMO precursor solutions, comprising:
   preparing a PCMO precursor solution;
   withdrawing samples of the PCMO precursor solution at intervals during a reaction phase of the PCMO precursor solution synthesis;
   analyzing the samples of the PCMO precursor solution by UV spectroscopy to determine UV transmissivity of the samples of the PCMO precursor solution at a wavelength of about 800 nm;
   forming a PCMO thin film from the samples of the PCMO precursor solution;
   determining electrical characteristics of the PCMO thin films formed from the samples of the PCMO precursor solution to identify PCMO thin films having optimal electrical characteristics;
   determining the UV transmissivity range of the PCMO thin films having optimal electrical characteristics; and
   monitoring future PCMO precursor solution synthesis from the UV transmissivity range of the PCMO thin films having optimal electrical characteristics to synthesize PCMO precursor solutions which will result in PCMO thin films having optimal electrical characteristics.

5. The method of claim 4 wherein said determining electrical characteristics of the PCMO thin films formed from the samples of the PCMO precursor solution to identify PCMO thin films having optimal electrical characteristics includes determining which PCMO precursor solution samples result in a PCMO thin film have switching properties and which do not result in a short forming during a reset process.

* * * * *